United States Patent [19]

Higuchi

[11] Patent Number: 5,398,210

[45] Date of Patent: Mar. 14, 1995

[54] SEMICONDUCTOR MEMORY DEVICE HAVING MEMORY CELLS REORGANIZABLE INTO MEMORY CELL BLOCKS DIFFERENT IN SIZE

[75] Inventor: Misao Higuchi, Tokyo, Japan

[73] Assignee: NEC Corporation, Tokyo, Japan

[21] Appl. No.: 250,688

[22] Filed: May 27, 1994

[30] Foreign Application Priority Data

May 27, 1993 [JP] Japan .................. 5-125709

[51] Int. Cl.$^6$ ............................... G11C 8/00
[52] U.S. Cl. .................. 365/230.03; 365/230.06
[58] Field of Search ............. 365/230.03, 230.06, 365/230.01, 230.04

[56] References Cited

U.S. PATENT DOCUMENTS 5,295,254 3/1994 Ogawa ................ 365/230.03

FOREIGN PATENT DOCUMENTS 63-282995 11/1988 Japan .
64-37640 2/1989 Japan .

OTHER PUBLICATIONS

"28F001BX-T/28F001BX-B 1M (12K×8) CMOS Flash Memory", Intel Corporation, 1991.

Primary Examiner—Joseph A. Popek
Assistant Examiner—A. Zarabian
Attorney, Agent, or Firm—Sughrue, Mion, Zinn, Macpeak & Seas

[57] ABSTRACT

An electrically erasable and programmable read only memory device stores pieces of organizing information in a block organizer after completion of a process of fabricating thereof for producing organizing signals, and a row address decoder and driver unit assumes memory cell blocks to be reorganized into virtual memory cell blocks in response to the organizing signals so that user can freely reorganize the memory cell blocks.

9 Claims, 6 Drawing Sheets

SEMICONDUCTOR MEMORY DEVICE HAVING MEMORY CELLS REORGANIZABLE INTO MEMORY CELL BLOCKS DIFFERENT IN SIZE

FIELD OF THE INVENTION

This invention relates to a semiconductor memory device and, more particularly, to a semiconductor memory device variable in memory block size.

DESCRIPTION OF THE RELATED ART

A typical example of the semiconductor memory device variable in memory block size is disclosed in Japanese Patent Publication of Unexamined Application (JA) No. 64-37640, and FIG. 1 illustrates the essential feature of the prior art cache memory system disclosed in the Japanese Patent Publication. The prior art cache memory system comprises a semiconductor memory device serving as a cache memory unit 1, a main memory unit 2 outside of the semiconductor memory device 1, a processing unit 3, an address bus system AB and a data bus system DB, and the processing unit 3 controls the data transfer from the main memory unit 2 through the address bus system AB and the data bus system DB to the cache memory unit 1.

A memory cell array 1a and a controller 1b are incorporated in the cache memory unit 1, and a change-over means 1c forms a part of the controller b. The memory cell array 1a is implemented by a plurality of addressable memory cells, and is broken down into a plurality of memory cell blocks. Though not shown in FIG. 1, a block control signal indicative of either 8 or 4 bytes per each memory cell block is supplied to the change-over means 1c, and the change-over means 1c causes the controller 1b to break the memory cell array 1a into 8-byte memory cell blocks or 4-byte memory cell blocks in accordance with the block control signal.

If the plurality of memory cells are organized into the 8-byte memory cell blocks, the processing unit 3 transfers 8-byte data information from the main memory unit 2 to the cache memory unit 1. On the other hand, if the change-over means 1c causes the controller 1b to reorganize the plurality of memory cells into the 4-byte memory cell blocks, the processing unit 3 transfers 4-byte data information from the main memory unit 2 to the cache memory unit 1.

Another prior art memory device variable in block size is disclosed in Japanese Patent Publication of Unexamined Application No. 63-282995, and the prior art memory device is called as a block access memory shown in FIG. 2. In the Japanese Patent Publication of Unexamined Application, a serial transfer memory is implemented by the block access memory.

In the block access memory, a memory cell array 20 is broken down into fundamental memory blocks 20a, 20b, 20c and 20d, and bit lines BL are coupled with the memory cells MC of the fundamental memory blocks 20a to 20d.

A plurality of word lines WL are selectively coupled with the memory cells MC of the fundamental memory blocks 20a to 20d, and a row address decoder 21 selectively energizes the word lines WL so that the associated memory cells MC of the fundamental memory blocks 20a to 20d put read-out data signals on the bit lines BL.

A plurality of sense amplifier units 22a, 22b, 22c and 22d are respectively coupled with the bit lines BL associated with the fundamental memory blocks 20a to 20d for amplifying the read-out data signals, and pre-settable shift registers 23a, 23b, 23c and 23d are further coupled with the bit lines BL. The input stage of each of the shift registers 23a to 23d is coupled with the output stage of the shift register through a signal line 23e, and the shift register 23a/23b/23c/23d is responsive to clock signals phi-1 and phi-2 for circulating the data bits indicated by the read-out data signals. The shift registers 23a to 23d are coupled through an array of switching transistors 24a, 24b, 24c and 24d with an output buffer circuit 25, and the output buffer circuit 25 produces a serial output data signal Dout.

The array of switching transistors 24a/24b/24c/24d is gated with control signals C1, C2, C3 and C4 for changing the bit length indicated by the serial output data signal Dout. Namely, a block decoder 26 and a 4-stage shift register 27 are provided for the array of switching transistors 24a to 24d for selectively transferring the read-out data signals from the shift registers 23a to 23d through the array of switching transistors 24a to 24d to the output data buffer 25. The block decoder 26 is responsive to address bits A8 and A9 for producing block selecting signals, and switching transistors 28a, 28b, 28c and 28d transfers the block selecting signals to the 4-stage shift register 27 in response to a clock signal phi-20. Switching transistors 29 are inserted between the stages of the shift register 27, and are responsive to clock signals phi-11, phi-12 and phi-13 for determining a data path in the 4-stage shift register 27. The shift register 27 allows the switching transistors 24a/24b/24c/24d to isolate a fundamental memory block from or combine the fundamental memory block with other fundamental memory block or blocks for changing the bit length. Thus, the fundamental memory blocks 20a to 20d are virtually combined with or isolated from one another for forming a memory cell block variable in size.

The prior art memory devices discussed hereinbefore are variable in memory block size or bit length, and are convenient for user. However, these prior art memory devices encounter a problem in that the memory block size or the bit length should be instructed at every power-on event, and the organization sequence prolongs an initialization for an electronic system incorporating the prior art memory devices. Another inconvenience or problem inherent in the prior art memory devices is that the memory cell blocks are equal in size to one another, and the prior art memory devices can not economically store data codes different in bit length.

A memory cell array incorporated in a prior art flash memory can be broken down into memory cell blocks different in size during a fabrication process. A user may request the manufacturer to evenly divide the memory cell array into the four memory cell blocks 31a, 31b, 31c and 31d as shown in FIG. 3A, and another user may need the memory cell array divided into a 256 k-bit memory cell block 32a, two 128 k-bit memory cell blocks 32b and 32c and a 512 k-bit memory cell block 32d as shown in FIG. 3B. The prior art flash memory can have memory cell blocks different in size. However, the organization of the memory cell array is only allowed in the fabrication process, and the memory cell array is never reorganized after completion of the process.

SUMMARY OF THE INVENTION

It is therefore an important object of the present invention to provide a semiconductor memory device which has a memory cell array reorganizable into memory cell blocks different in size in a non-volatile manner after the fabrication process.

To accomplish the object, the present invention proposes to sequentially energize row selecting lines over memory cell blocks physically separated from one another.

In accordance with the present invention, there is provided a semiconductor memory device comprising: a) a memory cell array having a plurality of memory cell blocks each implemented by a plurality of addressable memory cells; b) a block organizer storing pieces of organizing information in a non-volatile manner after completion of a process of fabricating the semiconductor memory device, and producing organizing signals indicative of an arrangement of virtual memory cell blocks formed from the plurality of memory cell blocks; c) a first address decoder means responsive to the organizing signals for assuming selected one or ones of the plurality of memory cell blocks to be one of the virtual memory cell blocks, the first address decoder circuit being further responsive to external address bits for selecting the addressable memory cells from the aforesaid one of the virtual memory cell blocks; and d) a second address decoder means responsive to other external address bits for selectively coupling the addressable memory cells with an interface.

BRIEF DESCRIPTION OF THE DRAWINGS

The feature and advantages of the semiconductor memory device according to the present invention will be more clearly understood from the following description taken in conjunction with the accompanying drawings in which.

DESCRIPTION OF THE PREFERRED EMBODIMENTS

First Embodiment

Figure 1:
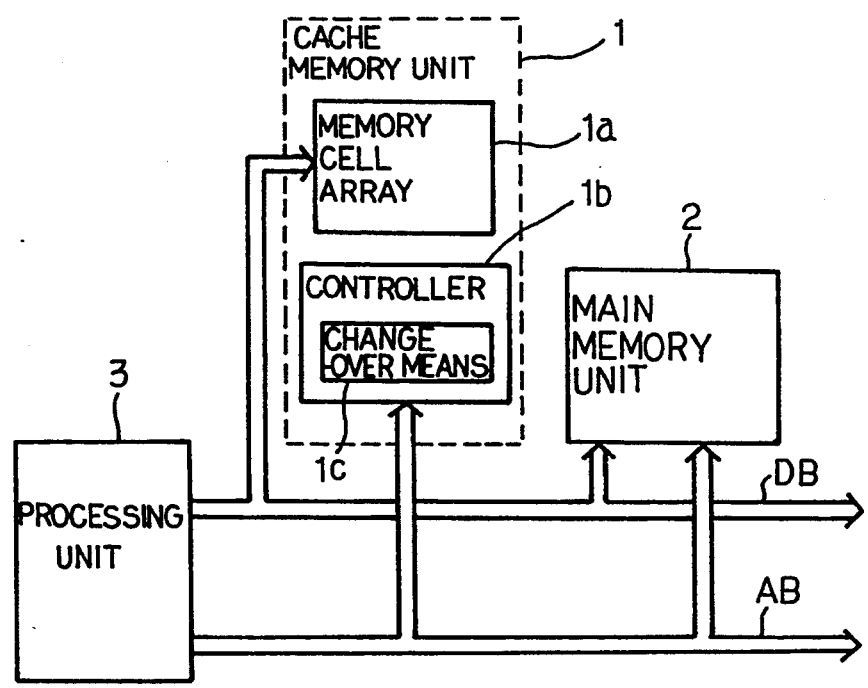
FIG. 1 is a block diagram showing the arrangement of the prior art cache memory system disclosed in Japanese Patent Publication of Unexamined Application No. 64-37640.
Figure 2:
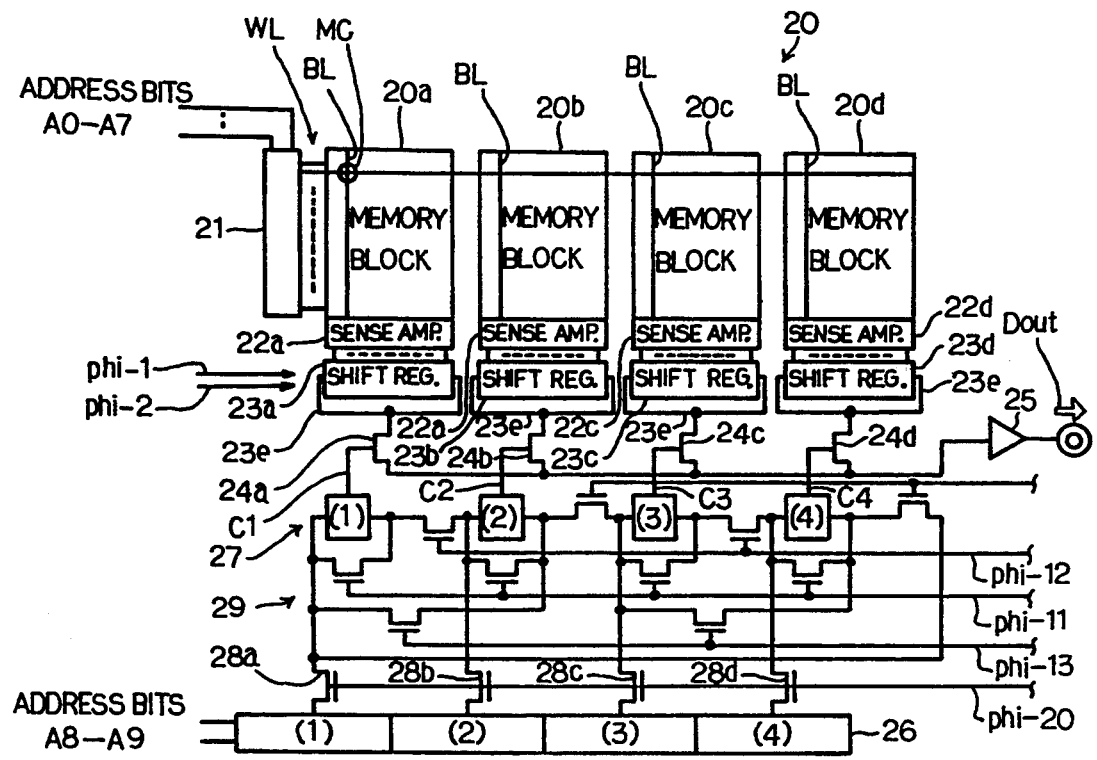
FIG. 2 is a circuit diagram showing the arrangement of the prior art block access memory disclosed in Japanese Patent Publication of Unexamined Application No. 63-282995.
Figure 3A:
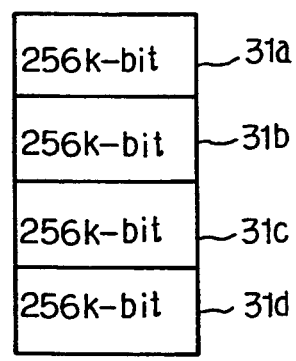
FIGS. 3A and 3B are views showing the differently organized memory cell array incorporated in the prior art flash memory.
Figure 3B:
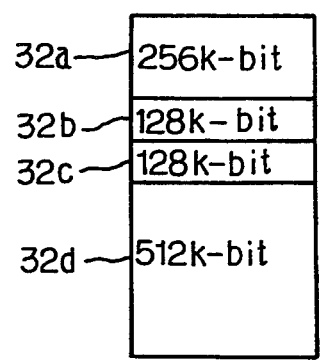
Figure 4:
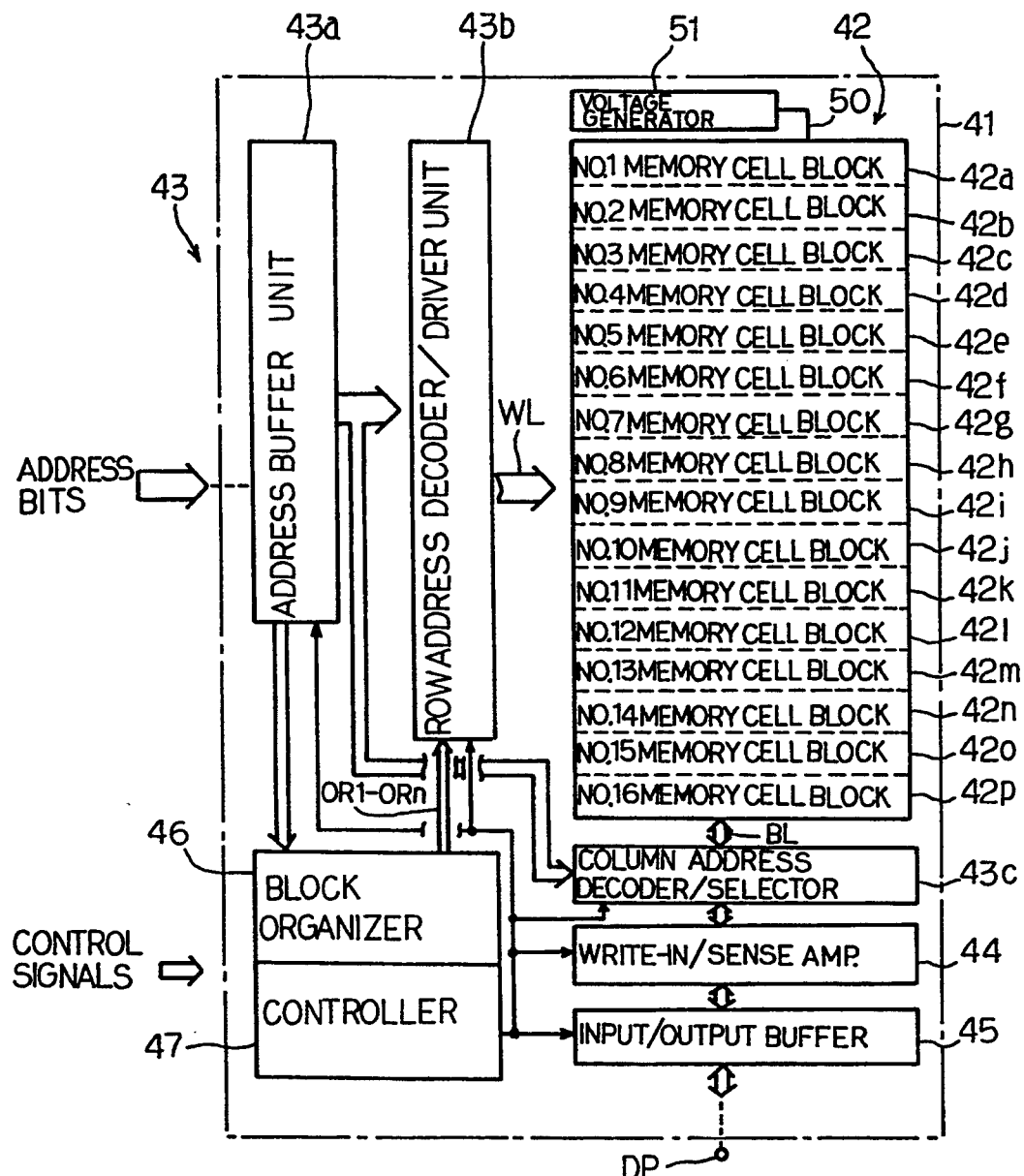
FIG. 4 is a block diagram showing the arrangement of a semiconductor memory device according to the present invention.

Referring to FIG. 4 of the drawings, a semiconductor memory device embodying the present invention is fabricated on a single semiconductor chip 41, and is a 1 mega-bit flash memory. The semiconductor memory device comprises a memory cell array 42 is physically broken down into sixteen memory cell blocks 42a to 42p each implemented by 64 k-bit memory cells. A single floating gate type field effect transistor may form each memory cell, and the two logic levels are corresponding to a high threshold level and a low threshold level of the single floating gate type field effect transistor. A plurality of row selecting lines WL and a plurality of bit lines BL are selectively coupled with the memory cells incorporated in the memory cell array 42 for a programming and a data access, and a source line system 50 is further coupled with the source nodes of the memory cells.

The semiconductor memory device further comprises an addressing system 43, and an address buffer unit 43a, a row address decoder/driver unit 43b and a column address decoder/selector unit are incorporated in the addressing system 43. Address bits are temporally stored in the address buffer unit 43a, and internal row address signals and internal column address signals are respectively distributed from the address buffer unit 43a to the row address decoder/driver unit 43b and the column address decoder/ selector unit 43c. The row address decoder/ driver unit 43b selectively energizes the row selecting lines WL, and causes the row selecting lines WL to couple the memory cells of the memory cell array 42 with the bit lines BL.

The semiconductor memory device further comprises a write-in/sense amplifier unit 44 for the programming and the data access. Namely, the write-in sub-unit is selectively coupled through the column address decoder/ selector 43c with the bit lines BL in the programming for supplying extremely high write-in voltage to the drain nodes of the selected memory cells, and hot electrons produced around the drain nodes are used for changing the thresholds of the selected memory cells. On the other hand, the sense amplifier sub-unit is selectively coupled through the column address decoder/selector unit 43c with the bit lines BL for supplying current to the drain nodes in the data access, and determines the thresholds of the selected memory cells or the logic levels of the accessed data bits on the basis of the voltage levels on the selected bit lines BL.

The semiconductor memory device further comprises an input/output buffer unit 45 coupled with an input/output data port DP, and an input data signal and an output data signal are transferred through the input-/output buffer unit 45 between the write-in/sense amplifier unit 44 and the input/output data port DP. The input/output buffer unit 45 serves as an interface.

A voltage generator 51 is coupled through the source line system 50 with the source nodes of the memory cells, and the accumulated electrons are evacuated from the memory cells as the Fowler-Nordheim tunneling current.

The row address decoder/driver unit 43b and the column address decoder/selector unit 43c can focus the programming and the data access on one of the memory cell blocks 42a to 42p. If one of the memory cell blocks 42a to 42p is specified, the row address decoder/driver unit 43 sequentially energizes the word lines WL associated therewith, and the programming and the data access are repeated for all the rows of memory cells incorporated in the selected memory cell block.

The semiconductor memory device embodying the present invention further comprises a block organizer 46 assisted with a controller 47. The address buffer unit 43a supplies the internal row address signals to the block organizer 46, and the block organizer 46 and the controller reorganize the sixteen memory cell blocks 42a to 42p into virtual memory blocks variable in size.

In detail, the organizer 46 comprises an input decoder circuit 46 responsive to the internal row address signals for producing decoded signals, a programming circuit 46b having a plurality of non-volatile memory circuits for storing organizing information and an output decoder circuit 46c responsive to the output signals C1 to Ci of the non-volatile memory circuits for producing a plurality of organizing signals OR1 to ORn from the output signals indicative of the organizing information. The organizing signals OR1 to ORn are supplied to the row address decoder/driver unit 43b so that the row address decoder/driver unit 43b reorganizes the memory cell blocks 42a into the virtual memory cell blocks. In this instance, eight non-volatile memory circuits form the programming circuit 46b, and the eight output signals C1 to Ci are decoded into $2^8$ organizing signals OR1 to ORn.

Figure 6:
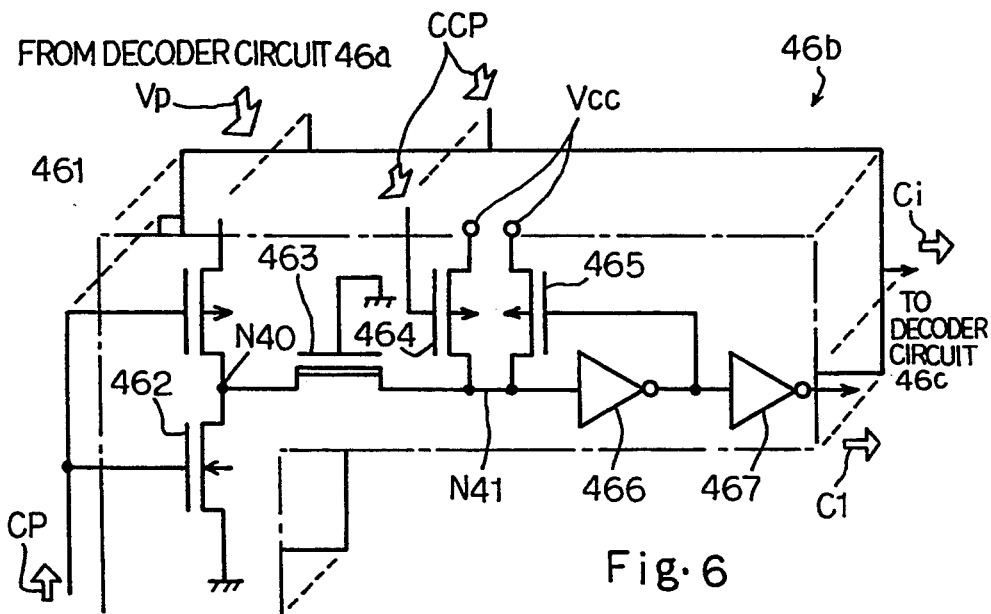
FIG. 6 is a circuit diagram showing the arrangement of a non-volatile memory circuit incorporated in the organizer.

Turning to FIG. 6 of the drawings, one of the nonvolatile memory circuits is illustrated in detail, and comprises a series combination of a p-channel enhancement type switching transistor 461 and an n-channel enhancement type switching transistor 462, an electrically programmable read only memory cell 463, p-channel enhancement type switching transistors 464 and 465, and inverters 466 and 467. The source node of the p-channel enhancement type switching transistor 461 is coupled through the decoder circuit 46a with one of the address pins where the address bits are supplied. The source node of the n-channel enhancement type switching transistor 462 is grounded, and the electrically programmable read only memory cell 463 is coupled between the common drain node N40 of the switching transistors 461 and 462 and the drain nodes N41 of the switching transistors 464 and 465. The source nodes of the p-channel enhancement type switching transistors 464 and 465 are coupled with a positive power voltage line Vcc, and the drain nodes N41 are coupled with the input node of the inverter 466. The p-channel enhancement type switching transistor 461 and the n-channel enhancement type switching transistor 462 serving as a first switching transistor and a second switching transistor, and the p-channel enhancement type switching transistors 464 and 465 and the inverter 466 as a whole constitute a charging circuit. The inverter 467 of each non-volatile memory circuit and the decoder circuit 46c serve as a signal producing circuit.

An internal control signal CP is supplied from the controller 47 to the gate electrodes of the switching transistors 461 and 462, and the complementary signal CCP of the internal control signal CP is supplied to the gate electrode of the p-channel enhancement type switching transistor 464. The output signal of the inverter 466 is supplied to the gate electrode of the p-channel enhancement type switching transistor 465. The output signal of the inverter 467 is decoded by the decoder circuit 46c, and the decoder circuit 46c supplies the organizing signals OR1 to ORn to the row address decoder/driver unit 43b.

The other non-volatile memory circuits are similar in circuit arrangement as the non-volatile memory circuit described hereinbefore.

Figure 5:
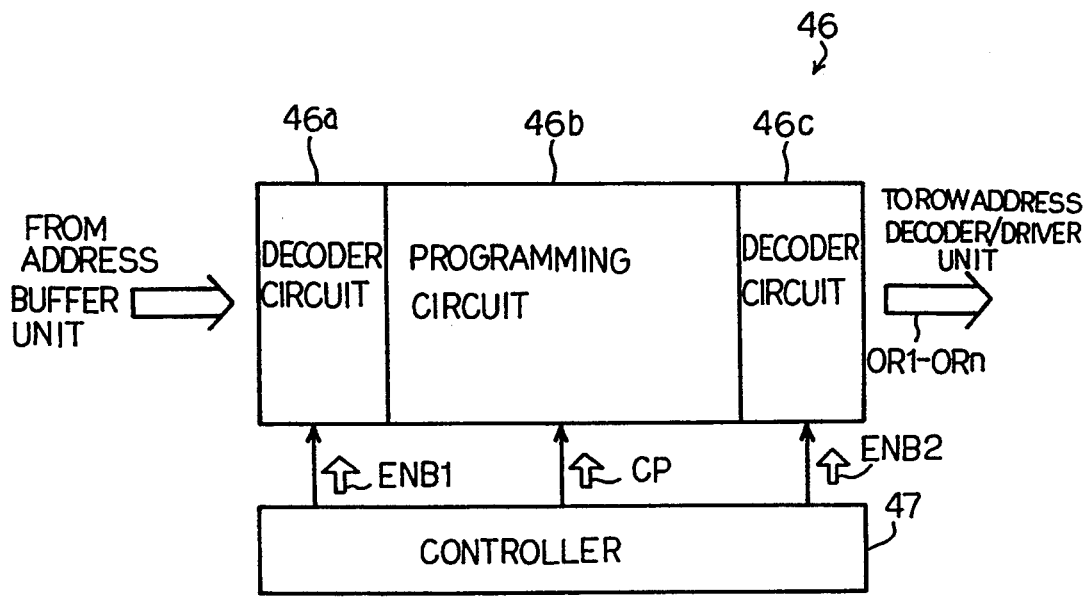
FIG. 5 is a block diagram showing the arrangement of an organizer incorporated in the semiconductor memory device.

The decoder circuits 46a and 46c are convenient for a large number of virtual memory cell blocks complexly arranged. However, if the arrangement of virtual memory cell blocks is simple, the decoder circuit 46c may be deleted. Moreover, if a small number of non-volatile memory circuits form the programming circuit 46b, the decoder circuit 46a may be deleted from the circuit arrangement shown in FIG. 5.

The non-volatile memory circuits thus arranged is programmed as follows. One of the external control signals indicative of a programming mode causes the controller 47 to establish the programming mode in the semiconductor memory device. In the programming mode, the internal control signal CP is fixed to a low or ground voltage level, and an enable signal ENB1 enables the decoder circuit 46a. However, the decoder circuit 46c is disabled. A write-in voltage Vp is selectively applied to the predetermined address pin, and an address signal indicative of one of the non-volatile memory circuits is supplied to other address pins. The address signal is assumed to indicate the non-volatile memory circuit illustrated in FIG. 6. The address signal is predecoded by the address buffer unit 43a, and the address predecoded signals are supplied from the address buffer unit 43a to the decoder circuit 46a. The decoder circuit 46a couples the predetermined address pin with the source node of the p-channel enhancement type switching transistor 461. However, other decoded signals are isolated from the predetermined address pin.

If a piece of organizing information is equivalent to a high threshold, the write-in voltage Vp is applied from the predetermined address pin to the source node of the p-channel enhancement type switching transistor 461. Since the p-channel enhancement type switching transistor 461 is turned on in the presence of the ground voltage level at the source node thereof, the common drain node N40 is elevated to the write-in voltage Vp, and the threshold of the electrically programmable read only memory cell 463 becomes high.

On the other hand, if the threshold of the electrically programmable read only memory cell 463 should be maintained in the low level, the write-in voltage Vp is not applied to the predetermined address pin.

The address signal indicative of one of the non-volatile memory circuits is sequentially changed, and the write-in voltage level Vp is selectively applied from the predetermined address pin to the common drain node N40. As a result, pieces of organizing information are stored in the non-volatile memory circuits as the high and/or low thresholds of the electrically programmable read only memory cells.

After the programming on the non-volatile memory circuits, the external control signal indicative of the programming mode is removed, and the semiconductor memory device enters a standard mode. In the standard mode, the data bits stored in the memory cell array 42 are accessed, and the memory cells are erased and programmed, if necessary.

In the standard mode, the controller 47 changes the internal control signal CP to the high voltage level, the enable signal ENB1 to an inactive level and an enable signal ENB2 to an active level. The decoder circuit 46a is disabled, and the decoder circuit 46c is enabled. The p-channel enhancement type switching transistors 461 of the non-volatile memory circuits turn off in the presence of the internal control signal CP of the high voltage level, and the common drain nodes N40 are electrically isolated from the predetermined address pin. On the other hand, the internal control signal CP of the high voltage level allows the n-channel enhancement type switching transistors 462 to turn on, and the complementary signal CCP of the ground voltage level causes the p-channel enhancement type switching transistor 464 to turn on. Then, the drain nodes N41 are charged to the positive power voltage level, and the inverter 466 causes the p-channel enhancement type switching transistor 465 to turn on with the output signal of the ground voltage level.

If the threshold is high, the electrically programmable read only memory cell 463 is turned off, and the drain nodes N41 is isolated from the ground voltage level, and the output signal of the inverter 467 is maintained at the positive high voltage level. On the other hand, if the threshold is low, the electrically programmable read only memory cell 463 is turned on, and the drain nodes N41 are discharged through the electrically programmable read only memory cell 463 and the n-channel enhancement type switching transistor 462. As a result, the inverter 467 changes the output signal to the ground voltage level. Thus, the non-volatile memory circuits supply the output signals indicative of the pieces of organizing information to the decoder circuit 46c, and the decoder circuit 46c produces the organizing signals OR1 to ORn.

Figure 7A:
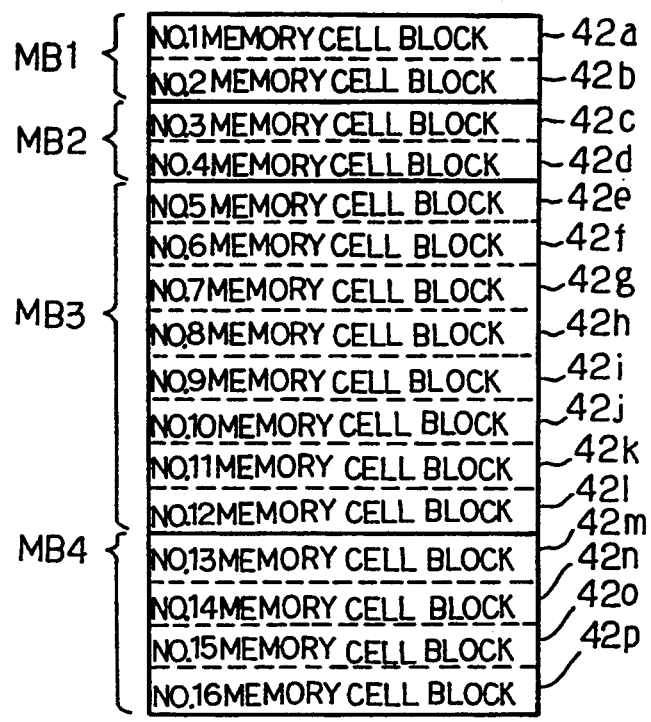
FIG. 7A is a view showing the memory cell blocks reorganized into virtual memory cell blocks.

In the standard mode, the row address decoder/driver unit 43b is responsive to the organizing signals OR1 to ORn for forming the sixteen memory cell blocks 42a to 42p into the virtual memory cell blocks. If the organizing signals OR1 to ORn are indicative of a first bit pattern, the row address decoder/driver unit 43b assumes the memory cell blocks 42a to 42p to be reorganized into four virtual memory cell blocks MB1, MB2, MB3 and MB4 as shown in FIG. 7A. The virtual memory cell blocks MB1 to MB4 are formed by the memory cell blocks 42a/42b, the memory cell blocks 42c/42d, the memory cell blocks 42e/42f/42g/42h/42i/42j/ 42k/42l and the memory cell blocks 42m/42n/42o/42p, and the row address decoder/driver unit 43b sequentially energizes all of the row selecting lines respectively coupled with the rows of memory cells incorporated in one of the virtual memory cell blocks MB1 to MB4. As a result, the data bits stored in the virtual memory cell block are sequentially read out from the bit lines BL, and the logic levels of the read-out data bits are determined by the sense amplifier sub-unit. The output data signal is produced from the read-out data bits, and is supplied through the input/output buffer unit 45 to the input/ output data port DP.

The virtual memory cell blocks MB1 to MB4 are established in the memory cell array 42 in the erasing operation, and the memory cells of each virtual memory cell block are concurrently erased in a single erasing operation.

Figure 7B:
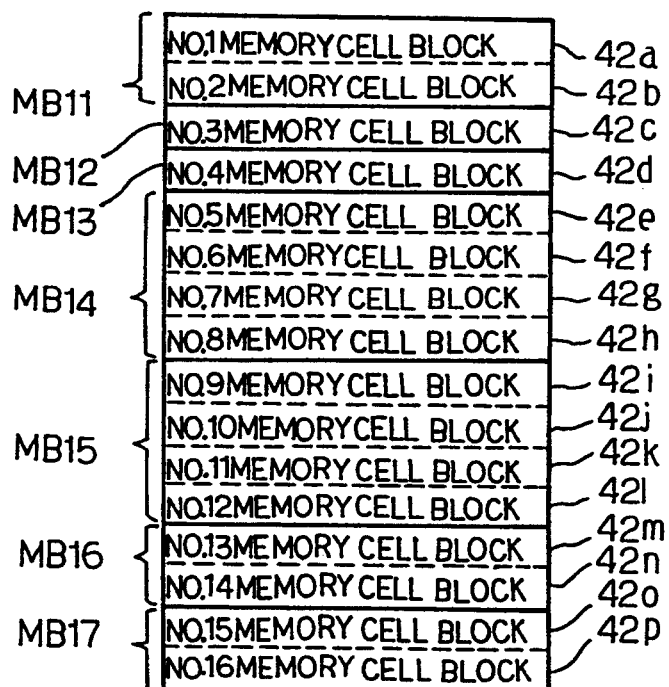
FIG. 7B is a view showing the memory cell blocks reorganized into virtual memory cell blocks different from those of FIG. 7A.

If the organizing signals OR1 to ORn are indicative of a second bit pattern, the row address decoder/driver unit 43b assumes the memory cell blocks 42a to 42p to be reorganized into seven virtual memory cell blocks MB11, MB12, MB13, MB14, MB15, MB16 and MB17 as shown in FIG. 7B. The virtual memory cell blocks MB1 to MB7 are formed by the memory cell blocks 42a/42b, the memory cell block 42c, the memory cell block 42d, the memory cell blocks 42e/42f/42g/42h, the memory cell blocks 42i/42j/42k/42l, the memory cell blocks 42m/42n and the memory cell blocks 42o/42p, and the row address decoder/ driver unit 43b sequentially energizes all of the word lines respectively coupled with the rows of memory cells incorporated in one of the virtual memory cell blocks MB1 to MB7.

As will be appreciated from the foregoing description, the non-volatile memory circuits are programmed after the fabrication process, and the organizing signals OR1 to ORn are produced at every power-on event in the standard mode. Moreover, the memory cell blocks 42a to 42p are arbitrarily combined for forming the virtual memory cell blocks different in size.

Second Embodiment

Figure 8:
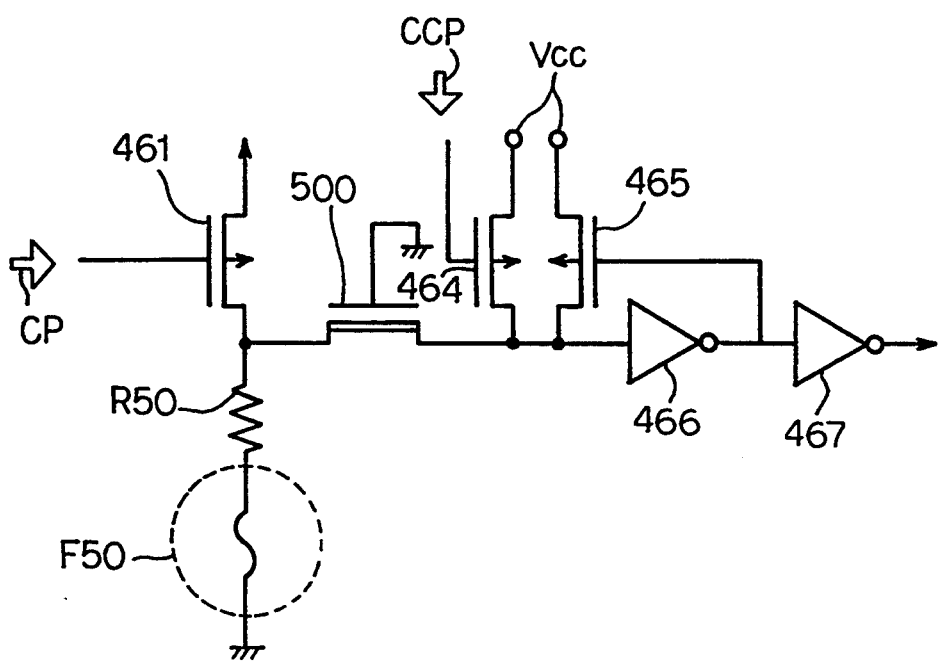
FIG. 8 is a circuit diagram showing the arrangement of another non-volatile memory circuit incorporated in another non-volatile memory circuit forming a part of a semiconductor memory device according to the present invention.

Turning to FIG. 8 of the drawings, a non-volatile memory circuit is incorporated in another semiconductor memory device embodying the present invention. The other components of the semiconductor memory device are similar to those of the first embodiment, and description on the other components is not incorporated hereinbelow for avoiding repetition.

In the non-volatile memory circuit shown in FIG. 8, the n-channel enhancement type switching transistor 462 and the electrically programmable read only memory cell 463 are replaced with a resistor R50/a fuse element F50 and a depletion type field effect transistor 500. The fuse element F50 is implemented by a polysilicon strip. The other circuit components of the non-volatile memory circuit are similar to those of the non-volatile memory circuit shown in FIG. 6, and are labeled with the same references without detailed description.

The non-volatile memory circuit is programmed by applying an extremely high voltage to the fuse element F50, and the organizing signals OR1 to ORn are produced from the pieces of organizing information stored in the non-volatile memory circuits. The row address decoder/driver unit assumes a group of the memory cell blocks to form a virtual memory cell block, and sequentially energizes all the row selecting lines associated with the virtual memory cell block.

The semiconductor memory device implementing the second embodiment achieves all the advantages of the first embodiment. However, the pieces of organizing information memorized in the non-volatile memory circuits are changed once.

Although particular embodiments of the present invention have been shown and described, it will be obvious to those skilled in the art that various changes and modifications may be made without departing from the spirit and scope of the present invention. For example, the present invention is applicable to another type of semiconductor memory device such as, for example, a standard electrically erasable and programmable read only memory device, an electrically programmable read only memory device, a standard read only memory device, a static random access memory device or a dynamic random access memory device.

What is claimed is:

1. A semiconductor memory device comprising:
   a) a memory cell array having a plurality of memory cell blocks each implemented by a plurality of addressable memory cells;
   b) a block organizer storing pieces of organizing information in a non-volatile manner after completion of a process of fabricating said semiconductor memory device, and producing organizing signals indicative of an arrangement of virtual memory cell blocks formed from said plurality of memory cell blocks;
   c) a first address decoder means responsive to said organizing signals for assuming selected one or ones of said plurality of memory cell blocks to be one of said virtual memory cell blocks, said first address decoder circuit being further responsive to external address bits for selecting the addressable memory cells from said one of said virtual memory cell blocks; and d) a second address decoder means responsive to other external address bits for selectively coupling said addressable memory cells with an interface.

2. The semiconductor memory device as set forth in claim 1, in which said first address decoder means sequentially selecting all of said addressable memory cells of said one of said plurality of virtual memory cell blocks.

3. The semiconductor memory device as set forth in claim 1, in which said addressable memory cells of each memory cell block are electrically erasable and programmable read only memory cells arranged in rows and columns, said first address decoder means serving as a row address decoder and driver unit operative to sequentially select all of the rows of electrically erasable and programmable read only memory cells from said one of said plurality of virtual memory cell block.

4. The semiconductor memory device as set forth in claim 1, in which said block organizer comprises a plurality of non-volatile memory circuits for memorizing said pieces of organizing information, respectively, said semiconductor memory device selectively entering into a programming mode for storing said pieces of organizing information in said block organizer and a standard mode for erasing data bits, writing new data bits and reading out said new data bits.

5. The semiconductor memory device as set forth in claim 4, in which each of said non-volatile memory circuits has a series combination of a first switching transistor, a first node and a second switching transistor coupled between a write-in voltage source and a constant voltage source, an electrically programmable read only memory cell coupled between said first node and a second node for memorizing one of said pieces of organizing information, a charging circuit coupled between a power voltage line and said second node and a signal producing circuit for producing one of said organizing signals, said first switching transistor being shifted between on-state in said programming mode and off-state in said standard mode, said second switching transistor being shifted between on-state in said standard mode and off-state in said programming mode, said charging circuit being enabled in said standard mode so that said signal producing circuit produces said one of said organizing signals.

6. The semiconductor memory device as set forth in claim 5, in which said block organizer further comprises a first decoder circuit responsive to external address bits for selecting one of said plurality of non-volatile memory circuits.

7. The semiconductor memory device as set forth in claim 5, in which said signal producing circuit comprises a logic circuit and a decoder circuit.

8. The semiconductor memory device as set forth in claim 4, in which each of said non-volatile memory circuits has a series combination of a first switching transistor, a first node, a resistor and a breakable fuse element coupled between a write-in voltage source and a constant voltage source, a depletion type transistor coupled between said first node and a second node, a charging circuit coupled between a power voltage line and said second node and a signal producing circuit for producing one of said organizing signals, said first switching transistor being shifted between on-state in said programming mode and off-state in said standard mode, said charging circuit being enabled in said standard mode so that said signal producing circuit produces said one of said organizing signals, one of said pieces of organizing information being stored by either maintaining or breaking said breakable fuse element.

9. An electrically erasable and programmable read only memory device fabricated on a semiconductor chip and selectively entering into a programming mode for storing pieces of organizing information and a standard mode for erasing data bits, writing new data bits and reading out said new data bits, comprising:

a) a memory cell array having a plurality of memory cell blocks each implemented by a plurality of memory cells arranged in rows and columns for storing said data bits and said new data bits;

b) an address buffer unit supplied with external address bits for producing first internal address signals in said standard mode and other external address bits for producing second internal address signals in said programming mode;

c) a block organizer having
  c-1) a first decoder circuit for producing decoded signals from said second internal address signals in said programming mode,
  c-2) a plurality of non-volatile memory circuits coupled with said first decoder circuit, said decoded signal sequentially enabling said plurality of non-volatile memory circuits for storing said pieces of organizing information, and
  c-3) a second decoder circuit operative to produce a plurality of organizing signals from said pieces of organizing information in said standard mode;

d) a row address decoder and driver unit responsive to said plurality of organizing signals for organizing said plurality of memory cell blocks into virtual memory cell blocks, said row address decoder and driver unit being further responsive to predetermined first internal address signals selected from said first internal address signals for sequentially selecting all of the rows of memory cells incorporated in one of said virtual memory cell blocks in said standard mode;

e) a column address decoder and selector unit responsive to other predetermined first internal address signals selected from said first internal address signals for sequentially selecting memory cells from said memory cells incorporated in said one of said virtual memory cell blocks in said standard mode;

f) a write-in and sense amplifying unit for transferring said new data bits between said column address decoder and selector unit and an input and output buffer unit in said standard mode; and g) a voltage generator connectable with source nodes of said memory cells incorporated in one of said plurality of virtual memory cell blocks for erasing said data bits in said standard mode.

* * * * *

UNITED STATES PATENT AND TRADEMARK OFFICE
CERTIFICATE OF CORRECTION

PATENT NO. : 5,398,210
DATED : March 14, 1995
INVENTOR(S) : Misao HIGUCHI

It is certified that error appears in the above-indentified patent and that said Letters Patent is hereby corrected as shown below:

Column 1, line 28, delete "b" and insert --1b--.

Column 4, line 1, delete "4" and insert --3--.

Signed and Sealed this

Sixth Day of August, 1996

Attest:

BRUCE LEHMAN

Attesting Officer    Commissioner of Patents and Trademarks